(12) United States Patent
Yumoto et al.

(10) Patent No.: US 11,572,275 B2
(45) Date of Patent: Feb. 7, 2023

(54) ALUMINUM NITRIDE FILM, METHOD OF MANUFACTURING ALUMINUM NITRIDE FILM, AND HIGH WITHSTAND VOLTAGE COMPONENT

(71) Applicants: SHIBAURA INSTITUTE OF TECHNOLOGY, Tokyo (JP); TOSHIBA MATERIALS CO., LTD., Yokohama (JP)

(72) Inventors: Atsushi Yumoto, Tokyo (JP); Mari Shimizu, Tokyo (JP); Tetsuo Inoue, Kanagawa (JP); Takashi Hino, Kanagawa (JP); Shuichi Saito, Kanagawa (JP)

(73) Assignees: SHIBAURA INSTITUTE OF TECHNOLOGY, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 53 days.

(21) Appl. No.: 17/335,466

(22) Filed: Jun. 1, 2021

(65) Prior Publication Data
US 2021/0284535 A1    Sep. 16, 2021

Related U.S. Application Data

(63) Continuation of application No. 16/125,524, filed on Sep. 7, 2018, now abandoned, which is a continuation (Continued)

(30) Foreign Application Priority Data

Mar. 8, 2016    (JP) .............................. JP2016-044525

(51) Int. Cl.
*C01B 21/072*    (2006.01)
*H01L 21/67*    (2006.01)
(Continued)

(52) U.S. Cl.
CPC ...... *C01B 21/0728* (2013.01); *C23C 14/0617* (2013.01); *C23C 14/28* (2013.01);
(Continued)

(58) Field of Classification Search
CPC . C01B 21/0728; C23C 14/0617; C23C 14/28; C23C 24/04; C23C 26/00;
(Continued)

(56) References Cited

U.S. PATENT DOCUMENTS

2004/0144927 A1    7/2004  Auner
2008/0182092 A1    7/2008  Bondokov
(Continued)

FOREIGN PATENT DOCUMENTS

CN    104040675 A    9/2014
EP    3012345 A1    4/2016
(Continued)

OTHER PUBLICATIONS

Ando et al, Jan. 2017, English Translation of JP-2017014569-A (Year: 2017).*
(Continued)

*Primary Examiner* — Nathan L Van Sell
(74) *Attorney, Agent, or Firm* — Foley & Lardner LLP

(57) ABSTRACT

An aluminum nitride film includes a polycrystalline aluminum nitride. A withstand voltage of the aluminum nitride film is 100 kV/mm or more.

11 Claims, 1 Drawing Sheet

Related U.S. Application Data of application No. PCT/JP2017/008487, filed on Mar. 3, 2017.

(51) Int. Cl.

| | | |
|---|---|---|
| *H01L 23/373* | (2006.01) | |
| *H05B 3/12* | (2006.01) | |
| *C23C 14/06* | (2006.01) | |
| *C23C 26/00* | (2006.01) | |
| *C23C 24/04* | (2006.01) | |
| *C23C 14/28* | (2006.01) | |
| *H05B 3/06* | (2006.01) | |
| *H05B 3/84* | (2006.01) | |

(52) U.S. Cl.
CPC .............. *C23C 24/04* (2013.01); *C23C 26/00* (2013.01); *H01L 21/67103* (2013.01); *H01L 23/3731* (2013.01); *H05B 3/06* (2013.01); *H05B 3/12* (2013.01); *H05B 3/84* (2013.01); *C01P 2002/60* (2013.01); *C01P 2002/72* (2013.01); *C01P 2002/74* (2013.01); *C01P 2002/76* (2013.01); *C01P 2006/40* (2013.01); *C01P 2006/90* (2013.01)

(58) Field of Classification Search
CPC . H01L 21/67103; H01L 23/3731; H05B 3/06; H05B 3/12; H05B 3/84; C01P 2002/60; C01P 2002/72; C01P 2002/74; C01P 2002/76; C01P 2006/40; C01P 2006/90
See application file for complete search history.

(56) References Cited

U.S. PATENT DOCUMENTS

| | | |
|---|---|---|
| 2014/0227527 A1 | 8/2014 | Brors |
| 2014/0286069 A1 | 9/2014 | Shinomoto |
| 2016/0181066 A1 | 6/2016 | Brors |

FOREIGN PATENT DOCUMENTS

| | | |
|---|---|---|
| JP | H08-311646 A | 11/1996 |
| JP | H11-200032 A | 7/1999 |
| JP | 2002-030432 A | 1/2002 |
| JP | 2003-003259 A | 1/2003 |
| JP | 2010-215465 A | 9/2010 |
| JP | 2011-214059 A | 10/2011 |
| JP | 2013-211442 A | 10/2013 |
| JP | 2015-501372 A | 1/2015 |
| KR | 2014-0082738 A | 7/2014 |
| TW | 2013-27615 A | 7/2013 |
| WO | WO-2013/045596 A2 | 4/2013 |

OTHER PUBLICATIONS

Yukari et al., "Fabrication of high electrical resistivity AlN film with Supersonic Free-Jet PVD," The 97th National Lecture Conference Papers Collection, (Jun. 2013) pp. 21-22 (with English machine translation).

Jaramillo-Fernandez et al., Sep. 2015, Thermal Conductivity of Polycrystalline Aluminum Nitride Films: Effects of the Microstructure, Interfacial Thermal Resistance and Local Oxidation (Year: 2015).

Iwata et al.; Dec. 2005; Hexagonal to cubic crystal structure transformation during aerosol deposition of aluminum nitride, Journal of Crystal Growth 275 (2005) e1269-e1273 (Year: 2005).

\* cited by examiner

ALUMINUM NITRIDE FILM, METHOD OF MANUFACTURING ALUMINUM NITRIDE FILM, AND HIGH WITHSTAND VOLTAGE COMPONENT

CROSS-REFERENCE TO RELATED APPLICATIONS

This application is continuation of U.S. patent application Ser. No. 16/125,524, filed Sep. 7, 2018, which is a continuation of prior International Application No. PCT/JP2017/008487, filed on Mar. 3, 2017 which is based upon and claims the benefit of priority from Japanese Patent Application No. 2016-044525, filed on Mar. 8, 2016; the entire contents of all of which are incorporated herein by reference.

FIELD

Embodiments described herein generally relate to an aluminum nitride film, a method of manufacturing an aluminum nitride film, and a high withstand voltage component.

BACKGROUND

Aluminum nitride (AlN) is used for, for example, a semiconductor element mounting substrate, a component for heater, a component for semiconductor manufacturing apparatus, and the like, by utilizing its high thermal conductivity. As aluminum nitride, there is known an aluminum nitride sintered compact having thermal conductivity of 200 W/m·K or more, for example. The aforementioned aluminum nitride sintered compact has high thermal conductivity through addition of sintering aids and performance of predetermined sintering process. The aforementioned aluminum sintered compact is used for a semiconductor element mounting substrate or the like, for example.

A withstand voltage of an aluminum nitride substrate which is sintered after sintering aids are added thereto is, for example, not less than 10 kV/mm nor more than 20 kV/mm. For this reason, a thickness of the aluminum nitride substrate is normally about 0.635 mm. Meanwhile, in an aluminum nitride single phase (single crystal of aluminum nitride), a theoretical value of thermal conductivity is about 320 W/m·K, and a theoretical value of a withstand voltage is about 1170 kV/mm. Specifically, the withstand voltage of the aluminum nitride sintered compact has a small value of about 1 to 2% of the value of the single crystal of aluminum nitride.

As a method of increasing a withstand voltage of aluminum nitride, for example, there can be cited a method of forming an aluminum nitride film with high resistance by using a supersonic free jet physical vapor deposition method (SFJ-PVD method). The aluminum nitride film formed by the SFJ-PVD method has volume resistivity of $13.7 \times 10^{12}$ Ω·cm, for example. The volume resistivity is a physical property value indicating difficulty in conducting electricity in a material.

Meanwhile, a withstand voltage of the aforementioned aluminum nitride film is about 50 kV/mm. The withstand voltage is a voltage value at which an insulating state can be maintained. The withstand voltage is also simply referred to as a withstand voltage. If dielectric breakdown tentatively occurs on a semiconductor element mounting substrate, it is not possible to maintain insulation performance of the substrate. Accordingly, this causes a trouble of a semiconductor device. Therefore, it has been required to improve a withstand voltage of an aluminum nitride film for maintaining insulation performance of a substrate.

DETAILED DESCRIPTION

Figure 1:
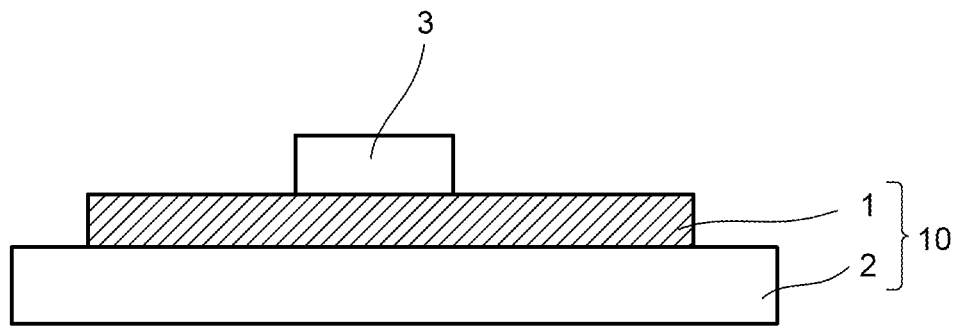
FIG. 1 is a view illustrating one example of a semiconductor element mounting substrate.

An aluminum nitride film of the present embodiment includes a polycrystalline aluminum nitride. A withstand voltage of the aluminum nitride film is 100 kV/mm or more.

A withstand voltage of an aluminum nitride film of the present embodiment is 100 kV/mm or more. The withstand voltage of the aluminum nitride film of the present embodiment is preferably 200 kV/mm or more. The withstand voltage is measured based on JIS-C-2110-1 (2010). As measurement conditions, an AC dielectric breakdown voltage is measured, and a voltage increase speed is set to 100 V/sec. A combination of electrodes for measurement is any of (1) a combination of an upper electrode having a diameter of 25 mm and a columnar shape and a lower electrode having a diameter of 75 mm and a columnar shape, (2) a combination of an upper electrode having a diameter of 25 mm and a columnar shape and a lower electrode having a diameter of 25 mm and a columnar shape, and (3) a combination of an upper electrode having a diameter of 20 mm and a spherical shape and a lower electrode having a diameter of 25 mm and a disk shape. As a base material for measuring the withstand voltage of the aluminum nitride film, it is preferable to use a conductive material such as a copper plate.

The aluminum nitride film of the present embodiment contains polycrystalline aluminum nitride as a main component. A proportion of aluminum nitride crystal grains in the aluminum nitride film which contains polycrystalline aluminum nitride as a main component is not less than 90 volume % nor more than 100 volume %. When an additional film is provided on a surface of the aluminum nitride film, the proportion of the aluminum nitride crystal grains is determined by excluding the additional film. In a similar manner, when an additional film is provided between the aluminum nitride film and a base material, the proportion of the aluminum nitride crystal grains is determined by excluding the additional film.

An average grain diameter of the aluminum nitride crystal grains is preferably 30 nm or less. When the average grain diameter of the aluminum nitride crystal grains exceeds 30 nm, pores may be formed in the aluminum nitride film. The formation of pores leads to dielectric breakdown. Further, by reducing the grain diameter, it is possible to extend a path of grain boundary. By extending the path of grain boundary, it is possible to improve the withstand voltage. The average grain diameter of the aluminum nitride crystal grains is more preferably 25 nm or less. Although a lower limit value of the average grain diameter is not particularly limited, it is preferably 5 nm or more. When the average grain diameter is less than 5 nm, there is a possibility that management of manufacturing processes becomes complicated.

The average grain diameter is determined, based on Scherrer equation, from a half value width of a diffraction peak of hexagonal aluminum nitride (PDF #25-1133 (100)

plane) determined through an X-ray diffraction (XRD) analysis. The Scherrer equation is represented by an equation $\tau=k\lambda/\beta \cos \theta$. $\tau$ indicates an average grain diameter, k indicates a form factor, $\lambda$ indicates a wavelength of X-ray, $\beta$ indicates a full width at half maximum of peak, and $\theta$ indicates a Bragg angle. In the Scherrer equation, it is set that the wavelength $\lambda$ of X-ray uses a Cu target (K$\alpha$-Cu), and the form factor k is 0.9. As the diffraction peak of hexagonal aluminum nitride (PDF #25-1133 (100) plane), a diffraction peak positioned at a diffraction angle (2$\theta$) of 33.2±1° is used.

The XRD analysis is performed through a focusing method or a thin film method. When the XRD analysis is performed through the focusing method, a base material made of a material which exerts no influence on XRD peak detection is used. As the aforementioned base material, for example, an amorphous substrate can be cited. A film thickness of aluminum nitride is 5 μm or more, for example. When the XRD analysis is performed through the thin film method, an incident angle is set to 5° or less, and it is preferably set to 1°. In the above-described method, it is possible to detect the XRD peak without being influenced by the base material.

A diffraction pattern obtained by the XRD analysis of the aluminum nitride film of the present embodiment preferably has a diffraction peak positioned at a diffraction angle 2$\theta$ of 33.2±1°. Further, it is preferable that the aforementioned diffraction pattern has a diffraction peak $I_{33.2°}$ positioned at a diffraction angle 2$\theta$ of 33.2±1° and a diffraction peak $I_{43.5°}$ positioned at a diffraction angle 2$\theta$ of 43.5±1°, and $I_{43.5°}/I_{33.2°}$ being an intensity ratio of the diffraction peak $I_{43.5°}$ to the diffraction peak $I_{33.2°}$ is preferably 0.01 or more. Furthermore, it is preferable that the aforementioned diffraction pattern has a diffraction peak based on an aluminum nitride crystal, and does not have a peak other than the diffraction peak based on the aluminum nitride crystal. As an analysis method of XRD, the focusing method or the thin film method is used, as described above.

When the diffraction peak is detected at the diffraction angle 2$\theta$ of 33.2±1°, this indicates that hexagonal aluminum nitride exists. As a crystal structure of aluminum nitride, there can be cited a hexagonal system (wurtzite structure) and a cubic system (zinc blende structure). Hexagonal aluminum nitride is thermally stable. For this reason, by making hexagonal aluminum nitride exist, it is possible to improve heat radiation property and plasma resistance.

When the diffraction peak is detected at the diffraction angle (2$\theta$) of 43.5±1°, this indicates that cubic aluminum nitride exists. When the intensity ratio $I_{43.5°}/I_{33.2°}$ is 0.01 or more, and further, when it is 0.05 or more, this indicates that a predetermined amount of cubic aluminum nitride exists with respect to hexagonal aluminum nitride.

It is preferable that the intensity ratio $I_{43.5°}/I_{33.2°}$ is 0.1 or more even when a spot diameter (or slit width) of X-ray is set to 100 μm. Further, it is preferable that the intensity ratio $I_{43.5°}/I_{33.2°}$ is 0.01 or more even when an arbitrary portion of the aluminum nitride film is subjected to the XRD analysis. When the predetermined intensity ratio can be obtained at the time of measuring an arbitrary portion, this indicates that hexagonal aluminum nitride and cubic aluminum nitride are dispersed in a homogeneous manner. The coexistence of hexagonal aluminum nitride and cubic aluminum nitride can improve the withstand voltage.

When the intensity ratio $I_{43.5°}/I_{33.2°}$ is set to 0.01 or more, and further, when it is set to 0.05 or more, it is possible to obtain an aluminum nitride film which is resistant to heat and which has a high withstand voltage. When the intensity ratio $I_{43.5°}/I_{33.2°}$ is increased to 0.1 or more, and further, when it is increased to 0.3 or more, it is possible to further improve the withstand voltage. Although an upper limit of the intensity ratio is not particularly limited, the intensity ratio $I_{43.5°}/I_{33.2°}$ is preferably 2.0 or less. When the intensity ratio exceeds 2.0, a proportion of hexagonal aluminum nitride is lowered. When the proportion of hexagonal aluminum nitride is lowered, a proportion of hexagonal system which is more stable in terms of energy is reduced, which may reduce the plasma resistance.

It is preferable that when performing the XRD analysis, a peak other than a diffraction peak based on the aluminum nitride crystal is not detected. When the peak other than the diffraction peak based on the aluminum nitride crystal is not detected, this indicates that crystal grains other than those of aluminum nitride and a sub-phase (grain boundary phase) do not exist. Specifically, this indicates an aluminum nitride film made of only aluminum nitride crystal grains (aluminum nitride crystal grains make up 100 mass %). This makes it possible to further improve the withstand voltage.

A film thickness of the aluminum nitride film is preferably 1 μm or more. When the film thickness is 1 μm or more, it is possible to increase the insulation performance. The film thickness is more preferably 2 μm or more. Although an upper limit of the film thickness is not particularly limited, it is preferably 100 μm or less. When the film thickness is not less than 1 μm nor more than 100 μm, it is possible to use the aluminum nitride film for a semiconductor element mounting substrate, a component for heater, and a component for semiconductor manufacturing apparatus to be described later, for example. A surface roughness Ra of the aluminum nitride film is preferably 3 μm or less, and more preferably 2 μm or less.

As described above, in the aluminum nitride film of the present embodiment, the withstand voltage can be set to 100 kV/mm or more, and further, it can be set to 200 kV/mm or more. Such an aluminum nitride film is suitable for various components. A high withstand voltage component of the present embodiment has an aluminum nitride film on a base material. Note that an additional film may be provided between the aluminum nitride film and the base material according to need. In a similar manner, an additional film may be provided on a surface of the aluminum nitride film. The high withstand voltage component of the present embodiment is preferably any one of a semiconductor element mounting substrate, a component for heater, and a component for semiconductor manufacturing apparatus.

FIG. 1 is a view illustrating one example of a semiconductor element mounting substrate. A semiconductor element mounting substrate 10 illustrated in FIG. 1 includes an aluminum nitride film 1, and a base material 2. The aluminum nitride film 1 is provided on the base material 2.

A semiconductor element 3 is provided on the semiconductor element mounting substrate 10. As the semiconductor element 3, for example, a light-emitting diode (LED) element, a power semiconductor element, or the like, is used. In recent years, reduction in size and realization of high power of a semiconductor element have been promoted. In accordance with this, a heating value has been increasing. For example, there is a possibility that an operation guaranteed temperature (junction temperature) of a SiC element or a GaN element exceeds 200° C.

In a conventional semiconductor element mounting substrate, an aluminum nitride sintered compact with a withstand voltage of about 10 to 20 kV/mm has been used. A withstand voltage of another ceramic substrate such as an alumina sintered compact substrate or a silicon nitride sintered compact substrate is also about the same as the above. On the other hand, the withstand voltage of the aluminum nitride film of the present embodiment is 100 kV/mm or more. For this reason, it is possible to reduce the thickness of the aluminum nitride film. Further, since it is possible to realize the insulation performance with the thin film, various substrates such as a ceramic substrate, a metal substrate, and a resin substrate can be used as the base material. Particularly, it is advantageous to use a conductive material such as the metal substrate.

Thermal conductivity of copper is about 398 W/m·K. Thermal conductivity of aluminum is about 236 W/m·K. By providing the aluminum nitride film on a base material being a metal substrate made of each of these materials, it is possible to suppress increase in thermal resistance due to the aluminum nitride film. Further, since it is possible to form the aluminum nitride film directly on the base material, there is no need to use a joining material such as a brazing material. Also from this point, it is possible to reduce the thermal resistance. Further, since the joining material is not used, it is possible to simplify the manufacturing processes. In other words, a semiconductor device including the semiconductor element 3 mounted on the semiconductor element mounting substrate 10 has high heat radiation property and can be reduced in thickness.

Figure 2:
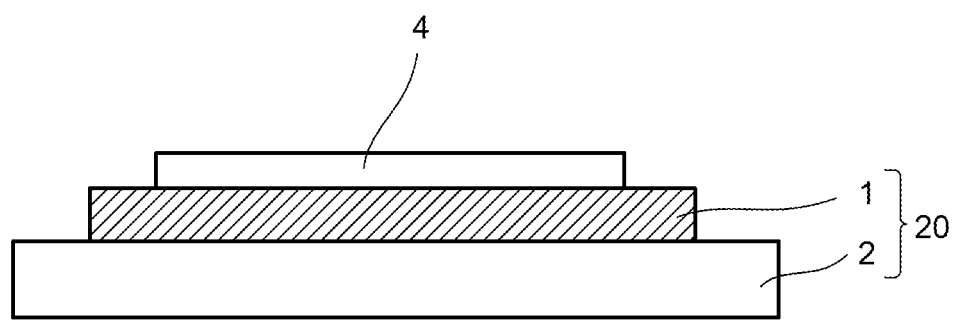
FIG. 2 is a view illustrating one example of a substrate for heater.

FIG. 2 is a view illustrating one example of a substrate for heater. A substrate for heater 20 illustrated in FIG. 2 includes an aluminum nitride film 1, and a base material 2. The aluminum nitride film 1 is provided on the base material 2. Further, a wire for heater 4 is provided on the substrate for heater 20.

As the base material 2, for example, there can be cited various substrates such as a ceramic substrate, a metal substrate, and a resin substrate. As the wire for heater 4, a material which generates heat through energization such as tungsten, for example, is used. When the wire for heater 4 is subjected to energization, a temperature of the substrate for heater 20 reaches a high temperature. This heat can be effectively radiated. For this reason, a heater having the wire for heater 4 provided on the substrate for heater 20 has high heat radiation property and can be reduced in thickness.

Figure 3:
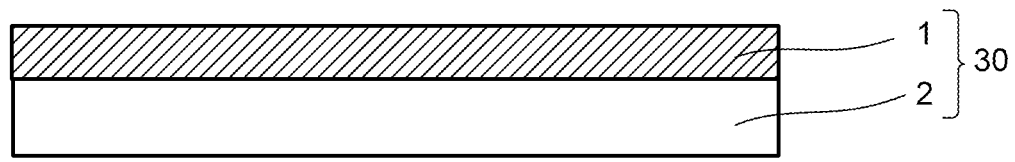
FIG. 3 is a view illustrating one example of a component for semiconductor manufacturing apparatus.

FIG. 3 is a view illustrating one example of a component for semiconductor manufacturing apparatus. A component for semiconductor manufacturing apparatus 30 illustrated in FIG. 3 includes an aluminum nitride film 1, and a base material 2. The aluminum nitride film 1 is provided on the base material 2. As the base material 2, for example, various materials such as ceramics, metal, and resin are used. A shape of the base material 2 is not limited to a plate shape, and it may employ various shapes such as a spherical shape (including a hemispherical shape), a curved shape, and a concavo-convex shape.

The aluminum nitride film 1 is excellent in not only the insulation performance but also the heat radiation property and the plasma resistance. For this reason, the component for semiconductor manufacturing apparatus 30 can be used for various semiconductor manufacturing processes in a CVD apparatus, a PVD apparatus, an etching apparatus, and the like. In other words, in a semiconductor manufacturing apparatus including the component for semiconductor manufacturing apparatus 30, durability of the component for semiconductor manufacturing apparatus 30 is excellent even if a plasma atmosphere is used. Further, as one example of the component for semiconductor manufacturing apparatus 30, an electrostatic chuck can be cited.

Next, a method of manufacturing the aluminum nitride film of the present embodiment will be described. Although the method of the present embodiment is not particularly limited, the following method can be cited as a method for efficiently obtaining the aluminum nitride film.

In the method of the present embodiment, it is preferable to form the aluminum nitride film through a supersonic free jet physical vapor deposition method (SFJ-PVD method) by using an aluminum nitride powder. Further, a film-forming process is preferably carried out under an inert atmosphere containing nitrogen.

The manufacturing method preferably has a process of forming fumes with an average grain diameter of 500 nm or less by making a raw material vaporization source to be subjected to laser irradiation to perform melting, a process of cooling the fumes to obtain a raw material powder, and a process of transporting the raw material powder into a vacuum chamber using a supersonic gas and making the raw material powder to be subjected to physical vapor deposition on a base material. The process of performing the physical vapor deposition is preferably the SFJ-PVD method.

As the SFJ-PVD method, for example, a method of using a physical vapor deposition apparatus can be cited. First, a process in which a thermoelectric element vaporization source is subjected to laser irradiation to perform melting, to thereby form fumes with an average grain diameter of 500 nm or less is performed. In the SFJ-PVD method, an aluminum target or an aluminum nitride target is set to a raw material vaporization source. Further, a purity of the aluminum target or the aluminum nitride target is preferably 3 N or more (99.9 mass % or more).

In the film-forming process, it is possible to form an aluminum nitride film while making fumes of aluminum or aluminum nitride to be subjected to nitriding in an inert atmosphere containing nitrogen. By adjusting a laser output, the average grain diameter of the fumes can be reduced to 500 nm or less, and further, it can be reduced up to 100 nm or less. The laser output is preferably not less than 3.0 W nor more than 5.0 W.

The inert atmosphere containing nitrogen is preferably a mixed gas atmosphere of nitrogen gas and helium gas. The nitrogen gas has a function of making the fumes of aluminum or aluminum nitride to be subjected to nitriding. Meanwhile, the helium gas can increase a flow velocity and thus it has a function of improving a collision speed of nanoparticles. The mixed gas of the nitrogen gas and the helium gas preferably satisfies a relation of [flow rate of nitrogen gas/(flow rate of nitrogen gas+flow rate of helium gas)]≥0.3. When [flow rate of nitrogen gas/(flow rate of nitrogen gas+flow rate of helium gas)] is less than 0.3, the force of the nitrogen gas is insufficient, resulting in that an insufficiently nitrided raw material powder may be formed.

Next, the process of cooling the aforementioned fumes to obtain the raw material powder is performed. The above-described helium gas has an effect of making the raw material powder turn into nanoparticles and cooling the fumes. By the cooling process, it is possible to obtain an aluminum nitride powder being a nanoparticle. The fumes are subjected to nitriding until when they are cooled.

Next, the raw material powder is transported into a vacuum chamber using an ultrasonic gas to make the raw material powder to be subjected to physical vapor deposition on a base material. First, the base material is disposed in the vacuum chamber. A degree of vacuum is $1.3 \times 10^{-3}$ Pa ($1 \times 10^{-5}$ Torr) or less, and further, it is preferably $1.3 \times 10^{-7}$ Pa or less. By controlling the degree of vacuum, the raw material powder (aluminum nitride powder) can be transported at high speed into the vacuum chamber. This makes it possible to form a film of aluminum nitride crystal grains on the base material.

EXAMPLES

Examples 1 to 7, Comparative Examples 1 and 2

Aluminum nitride films were formed by the SFJ-PVD method. As each of base materials, a copper plate with a plate thickness of 0.3 mm was used. As a raw material vaporization source, an aluminum target or an aluminum nitride target was used. A purity of each of the targets was 99.9 mass % (3 N) or more. Flow rates of nitrogen ($N_2$) gas and helium (He) gas in a chamber to be laser-irradiated to the raw material vaporization source were adjusted to satisfy ratios shown in Table 1. Further, the laser was output under conditions shown in Table 1. Furthermore, a pressure in the vacuum chamber was set to $1.3 \times 10^{-3}$ Pa or less. Results thereof are shown in Table 1.

TABLE 1

| | Raw Material Vaporization Source (Target) | Flow Rate of Nitrogen Gas/ (Flow Rate of Nitrogen Gas + Flow Rate of Helium Gas) | Laser Output (W) | Film Thickness (μm) |
| --- | --- | --- | --- | --- |
| Example 1 | Al | 1 | 3 | 10 |
| Example 2 | Al | 1 | 4 | 3 |
| Example 3 | Al | 1 | 3.5 | 3 |
| Example 4 | AlN | 0.8 | 4 | 3 |
| Example 5 | Al | 1 | 4.5 | 14 |
| Example 6 | Al | 1 | 4 | 12 |
| Example 7 | Al | 1 | 3.6 | 2.5 |
| Comparative Example 1 | AlN | 0.1 | 3 | 30 |
| Comparative Example 2 | AlN | 0.2 | 3 | 10 |

In Comparative Example 1 and Comparative Example 2, [flow rate of nitrogen gas/(flow rate of nitrogen gas+flow rate of helium gas)] is less than 0.3. Regarding the aluminum nitrogen films according to Examples and Comparative Examples, the withstand voltage, the average grain diameter, and the intensity ratio $I_{43.5°}/I_{33.2°}$ based on the XRD analysis were determined. The measurement of the withstand voltage was performed based on JIS-C-2110-1 (2010). Further, the measurement was performed in a manner that an AC dielectric breakdown voltage was measured, and a voltage increase speed was set to 100 V/sec. Furthermore, a combination of an upper electrode having a spherical shape and a lower electrode having a disk shape was employed.

The measurement of the average grain diameter and the diffraction peak through the XRD analysis was performed based on the thin film method by setting an incident angle to 1° or less. As measurement conditions of XRD, a Cu target (Kα-Cu) was used, a tube voltage was set to 45 kV, and a tube current was set to 200 mA. From results of the XRD analysis, $I_{43.5°}/I_{33.2°}$ being an intensity ratio of the diffraction peak $I_{43.5°}$ to the diffraction peak $I_{33.2°}$ was determined. Further, the average grain diameter was calculated, based on Scherrer equation, from a half value width of a diffraction peak of hexagonal aluminum nitride (PDF #25-1133 (100) plane). Further, a form factor k in the Scherrer equation was set to 0.9. Results thereof are shown in Table 2.

TABLE 2

| | Withstand voltage (kV/mm) | Average Grain Diameter (nm) | Intensity Ratio ($I_{43.5°}/I_{33.2°}$) |
| --- | --- | --- | --- |
| Example 1 | 170 | 17 | 0.14 |
| Example 2 | 200 | 18.2 | 0.33 |
| Example 3 | 460 | 19 | 1.6 |
| Example 4 | 230 | 20 | 0.8 |
| Example 5 | 110 | 16.6 | 0.08 |
| Example 6 | 120 | 30.2 | 0.09 |
| Example 7 | 680 | 12 | 0.05 |
| Comparative Example 1 | 1 | 28 | 0 |
| Comparative Example 2 | 57 | 16.1 | 0.002 |

As can be seen from Table, the withstand voltage of each of the aluminum nitride films according to Examples was 100 kV/mm or more. Further, in each of the aluminum nitride films according to Examples, the withstand voltage was able to be increased to 170 kV/mm or more when the intensity ratio $I_{43.5°}/I_{33.2°}$ was 0.01 or more. As described above, even when the film thickness of each of the aluminum nitride films according to Examples was thin, the excellent property of withstand voltage was able to be obtained. For this reason, the aluminum nitride film can be used for components in various fields such as a semiconductor element mounting substrate, a substrate for heater, and a component for semiconductor manufacturing apparatus.

In Comparative Example 1, metal aluminum was formed, although an amount thereof was small, and thus the withstand voltage was lowered. It can be considered that this is because the nitriding of the raw material was insufficient since the nitrogen gas was not used at the time of performing the laser irradiation on the raw material vaporization source. Further, in Comparative Example 2, the withstand voltage was lowered since the flow rate of the nitrogen gas was insufficient and thus the nitriding treatment was performed in an inhomogeneous manner.

While certain embodiments of the present invention have been exemplified, these embodiments have been presented by way of example only, and are not intended to limit the scope of the inventions. Indeed, the novel embodiments described herein may be embodied in a variety of other forms; furthermore, various omissions, substitutions, changes, and the like in the form of the embodiments described herein may be made without departing from the spirit of the inventions. The accompanying claims and their equivalents are intended to cover such forms or modification examples as would fall within the scope and spirit of the inventions. Further, the aforementioned respective embodiments can be mutually combined to be carried out.

What is claimed is:

1. A method of manufacturing a high withstand voltage component for a semiconductor element mounting substrate, a heater, or a semiconductor manufacturing apparatus, the method comprising:
    forming an aluminum nitride film onto a base material through a supersonic free jet physical vapor deposition method, the aluminum nitride film including a polycrystalline aluminum nitride, the polycrystalline aluminum nitride including aluminum nitride crystal grains, and an average grain diameter of the grains being 30 nm or less,
    wherein a withstand voltage of the aluminum nitride film is 100 kV/mm or more.

2. The method according to claim 1, wherein a proportion of the grains in the aluminum nitride film is not less than 90 volume % nor more than 100 volume %.

3. The method according to claim 1, wherein the withstand voltage is 200 kV/mm or more.

4. The method according to claim 1, wherein an X-ray diffraction pattern obtained by an X-ray diffraction analysis of the aluminum nitride film has a diffraction peak positioned at a diffraction angle 2θ of 33.2±1°.

5. The method according to claim 1, wherein:
an X-ray diffraction pattern obtained by an X-ray diffraction analysis of the aluminum nitride film has a first diffraction peak positioned at a diffraction angle 2θ of 33.2±1° and a second diffraction peak positioned at a diffraction angle 2θ of 43.5±1°; and
a ratio of intensity of the second diffraction peak to intensity of the first diffraction peak is 0.01 or more.

6. The method according to claim 1, wherein an X-ray diffraction pattern obtained by an X-ray diffraction analysis of the aluminum nitride film has a diffraction peak based on an aluminum nitride crystal, and does not have a diffraction peak other than the diffraction peak based on the aluminum nitride crystal.

7. The method according to claim 1, wherein the polycrystalline aluminum nitride includes hexagonal aluminum nitride and cubic aluminum nitride.

8. The method according to claim 1, wherein a surface roughness Ra of the aluminum nitride film is 3 μm or less.

9. The method according to claim 1, wherein a thickness of the aluminum nitride film is 1 μm or more.

10. The method according to claim 1, wherein the aluminum nitride film is formed under an inert atmosphere containing nitrogen.

11. The method according to claim 1, wherein the aluminum nitride film is formed under an inert atmosphere containing helium.

* * * * *